United States Patent
Yasuda et al.

(10) Patent No.: US 10,236,191 B2
(45) Date of Patent: Mar. 19, 2019

(54) WAFER DRYING APPARATUS AND METHOD FOR DRYING A WAFER

(71) Applicant: SHIN-ETSU HANDOTAI CO., LTD., Tokyo (JP)

(72) Inventors: Taichi Yasuda, Kita-ku (JP); Tatsuo Enomoto, Setagaya-ku (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 322 days.

(21) Appl. No.: 15/035,982

(22) PCT Filed: Nov. 19, 2014

(86) PCT No.: PCT/JP2014/005809
§ 371 (c)(1),
(2) Date: May 11, 2016

(87) PCT Pub. No.: WO2015/092975
PCT Pub. Date: Jun. 25, 2015

(65) Prior Publication Data
US 2016/0276180 A1 Sep. 22, 2016

(30) Foreign Application Priority Data
Dec. 20, 2013 (JP) ................................ 2013-264129

(51) Int. Cl.
*F26B 5/04* (2006.01)
*H01L 21/67* (2006.01)
*H01L 21/66* (2006.01)

(52) U.S. Cl.
CPC ........ *H01L 21/67034* (2013.01); *H01L 22/10* (2013.01); *H01L 22/12* (2013.01)

(58) Field of Classification Search
CPC . H01L 21/67034; H01L 21/6708; F26B 11/82
(Continued)

(56) References Cited

U.S. PATENT DOCUMENTS

| | | | | |
|---|---|---|---|---|
| 6,073,369 A | * | 6/2000 | Yasuyuki | .................. F26B 5/14 34/381 |
| 7,373,736 B2 | * | 5/2008 | Miya | ................. H01L 21/67028 34/443 |
| 2009/0032070 A1 | * | 2/2009 | Randhawa | ........ H01L 21/02052 134/52 |

FOREIGN PATENT DOCUMENTS

| | | |
|---|---|---|
| JP | H09-159360 A | 6/1997 |
| JP | H10-275792 A | 10/1998 |
| JP | 2009-088442 A | 4/2009 |

OTHER PUBLICATIONS

Feb. 24, 2015 Search Report issued in International Patent Application No. PCT/JP2014/005809.

* cited by examiner

*Primary Examiner* — John P McCormack
(74) *Attorney, Agent, or Firm* — Oliff PLC

(57) ABSTRACT

A wafer drying apparatus includes air supply unit having first and second air supply tube provided at respective first and second front-surface side of wafer, and wafer holding unit configured to vertically hold wafer, and configured so that wafer relatively moves with respect to air supply unit, plurality of first air outlets separated from each other at predetermined intervals are provided at wafer side of first air supply tube, plurality of second air outlets separated from each other at predetermined intervals are provided at wafer side of second air supply tube, plurality of first and second air outlets are respectively provided to form an angle with respect to vertical direction regarding wafer as to blow air from peripheral portion to central portion with respect to central line in vertical direction of wafer. It is possible to provide wafer drying apparatus with simple structure, which reduces undried portion without degrading productivity.

7 Claims, 9 Drawing Sheets

(58) Field of Classification Search
USPC .......................................... 34/413, 443, 487
See application file for complete search history.

WAFER DRYING APPARATUS AND METHOD FOR DRYING A WAFER

BACKGROUND OF THE INVENTION

1. Field of the Invention

The present invention relates to a wafer drying apparatus which performs drying processing on a wafer such as a semiconductor wafer and a method for drying a wafer using the wafer drying apparatus, and, more particularly, a wafer drying apparatus which performs drying by blowing air to a wafer and a method for drying a wafer using the wafer drying apparatus.

2. Description of the Related Art

Conventionally, both surfaces of a square substrate such as a liquid crystal substrate subjected to wet surface treatment have been dried by blowing air to the square substrate from a slit-shaped gas jetting port while the square substrate are horizontally conveyed (see, for example, Patent Literature 1 and Patent Literature 2).

Further, silicon wafer processing process also includes process of performing drying processing. For example, in process in which a slurry, drug solution, or the like, is used, a wafer gets wet, and this wet wafer is dried or cleaned and dried during intermediate or final process of processing for various purposes.

The purposes of drying in the intermediate process include improving a cleanliness level of the wafer, facilitating conveyance to the next process, adapting the wafer to an intermediate quality examination, and the like.

Further, the purposes of drying in the final process include improving a cleanliness level of the wafer, adapting the wafer to a final quality examination, adapting the wafer to shipment, and the like.

While, typically, different drying methods are selected according to purposes of each process or adapted cleaning, typical drying methods include air blow, spin drying, IPA steam drying, IPA direct substitution, vacuum/reduced-pressure drying, Marangoni drying, and the like.

In the present invention, attention is not focused on the final process in which a strict cleanliness level is required, but is focused on the intermediate process. In the intermediate process in which requirements for the cleanliness level are not strict, in order to reduce equipment cost and to improve productivity, a cleaning and drying method which is as simple as possible according to the purposes are desirable.

On the background as described above, drying has been implemented with an apparatus having a simple structure as illustrated in FIG. 5.

That is, both surfaces of a wafer 220 are dried at the same time by blowing air 212 while making the wafer 220 pass upward between two pipes (a first air supply tube 204 and a second air supply tube 206) respectively having a plurality of air outlets (a first air outlet 208 and a second air outlet 210) separated from each other at predetermined intervals.

In this manner, droplets on a surface of the wafer 220 move downward as the wafer 220 moves upward by the blown air 212 and gravity, and drop from the wafer 220.

Then, when the wafer 220 completely passes between the two pipes (the first air supply tube 204 and the second air supply tube 206), drying of the whole surface of the wafer 220 is finished.

It should be noted that FIG. 5(a) is a diagram of a drying apparatus 200 viewed from a side, and FIG. 5(b) is a diagram of the drying apparatus 200 viewed from the side when the drying apparatus 200 in FIG. 5(a) is rotated by 90 degree in a horizontal direction.

CITATION LIST

Patent Literatures

[Patent Literature 1]
Japanese Unexamined Patent Publication (Kokai) No. Hei 10-275792
[Patent Literature 2]
Japanese Unexamined Patent Publication (Kokai) No. Hei 09-159360

SUMMARY OF THE INVENTION

However, it has turned out that in the above-described method which has been employed so far, an undried portion may occur as described below.

That is, as illustrated in FIG. 6, when air 212 blown from air outlets collides with a surface of a wafer 220, pressure distribution is produced. Therefore, an undried portion is likely to occur at a portion where the pressure is low (a portion corresponding to an area between the air outlets), and an undried portion 230 longitudinally occurs as illustrated in FIG. 7.

As described above, typically, in drying in the intermediate process, requirements for a cleanliness level are not strict. However, when an intermediate examination is performed, an undried portion lowers reliability of a measurement result. The intermediate examination described here includes, for example, a wafer thickness/shape measurement apparatus using a laser displacement sensor, a contact-type thickness measurement apparatus, a wafer thickness/shape measurement apparatus utilizing electrostatic capacity, a wafer end face shape measurement apparatus using a CCD camera, a contact-type roughness measurement apparatus, a roughness measurement apparatus utilizing phase interference, and the like.

FIG. 8 illustrates an example of measurement using an optical wafer cross-sectional shape measurement apparatus.

FIG. 8(a) illustrates a measurement flow, and FIG. 8(b) illustrates a measured portion.

FIG. 8(c) illustrates a shape measurement result (first measurement result) of a wafer in which undried portions occur at a wafer peripheral portion and in the vicinity of a central portion using a laser displacement sensor, and FIG. 8(d) illustrates a shape measurement result (second measurement result) using a laser displacement sensor of a wafer which is dried again to eliminate the undried portions using a laser displacement sensor.

In FIG. 8(c), because a noise level exceeds a level which can be processed with a measurement apparatus due to influence of droplets, data at this portion is deleted, the shape is broken (see the central portion of the wafer), or the shape changes precipitously (see the peripheral portion of the wafer).

In FIG. 8(d) which illustrates a result of measuring the shape again after drying this wafer completely, there is no discontinuous change of the shape as found in FIG. 8(c), and the shape becomes continuous.

It can be seen from FIG. 8 that a wafer which includes an undried portion exhibits an abnormal shape in the shape measurement. Therefore, in order to improve reliability of the measurement, it is necessary to perform improvement to prevent occurrence of an undried portion.

While it can be expected that an undried portion can be reduced by drying the wafer again as described above or by lowering moving velocity of the wafer to extend a drying period, both incurs reduction of productivity.

Further, an undried portion mainly includes two types: an undried portion on a surface of the wafer and an undried portion at an end face of the wafer.

First, the undried portion on the surface of the wafer will be described.

As illustrated in FIG. 6, the air outlets are disposed at predetermined intervals. Gas blown from these outlets cause pressure distribution on the wafer. That is, the pressure is high at positions corresponding to the outlets, while the pressure is low between the outlets.

A liquid existing like a puddle on the wafer dispersedly moves toward a portion where the pressure is low due to this pressure distribution.

Therefore, droplets are likely to be dispersed and left at the portion where the pressure is low.

As drying using the drying apparatus 200 in FIG. 5 is performed by dropping droplets on the wafer on the lower side of the wafer, as illustrated in FIG. 5(*b*), outlets are often not horizontal and face obliquely downward to facilitate downward movement.

However, if the outlets face downward excessively, a distance between the outlets and the wafer becomes long, a blowing pressure on the wafer wholly decreases, and undried portions are more likely to occur particularly at portions corresponding to portions between the outlets.

The undried portion at the end face of the wafer will be explained next with reference to FIG. 9.

FIG. 9(*a*) is a diagram of the drying apparatus 200 viewed from the side, and FIG. 9(*b*) is a diagram of the drying apparatus 200 viewed from the side when the drying apparatus 200 in FIG. 9(*a*) is rotated by 90 degree in a horizontal direction. It should be noted that, in FIG. 9(*a*), air supply tubes are omitted.

At the end face of the wafer 220, while some part of a liquid to which the air is blown, scatters outside the wafer, the other part remains adhering to the end face and left as droplets 234.

A liquid moving downward on the surface of the wafer is relatively likely to drop due to wafer moving velocity (outlet moving velocity on the wafer) and movement of a substantial amount of the liquid.

On the other hand, the droplets 234 adhering to the end face of the wafer 220 slowly move downward along the end face of the wafer 220 by gravity. As an amount of the droplets is relatively small, the droplets are less likely to drop due to surface tension of the liquid. As the droplets slowly move in this manner, when the droplets reach a lowermost point, the outlet nozzles have already passed, an opportunity to blow air to the droplets at the lowermost point of the wafer 220 is missed, and the droplets are likely to be left undried.

Further, even if there is an opportunity to blow air to the droplets at the lowermost point of the wafer 220, the droplets 236 move to a portion where the atmospheric pressure is low due to a slight difference in the height or angles of the outlets at the front surface and the back surface of the wafer 220, which makes it difficult to effectively drop the droplets.

The present invention has been made in view of the above-described problems, and an object of the present invention is to provide a wafer drying apparatus having a simple structure, which can reduce an undried portion without reducing productivity, and a drying method using the wafer drying apparatus.

To achieve the above-described object, the present invention provides a wafer drying apparatus for drying both surfaces of a wafer at the same time, the wafer drying apparatus including an air supply unit having a first air supply tube provided on a first front-surface side of the wafer and a second air supply tube provided on a second front-surface side of the wafer, and a wafer holding unit configured to vertically hold the wafer, wherein the wafer is configured to relatively move with respect to the air supply unit, a plurality of first air outlets separated from each other at predetermined intervals are provided at the wafer side of the first air supply tube, a plurality of second air outlets separated from each other at predetermined intervals are provided at the wafer side of the second air supply tube, and the plurality of first air outlets and the plurality of second air outlets are provided to form an angle with respect to a vertical direction regarding the wafer so as to respectively blow air from a peripheral portion toward a central portion with respect to a central line in a vertical direction of the wafer.

In this manner, by providing the plurality of first air outlets separated from each other at predetermined intervals and the plurality of second air outlets separated from each other at predetermined intervals to form an angle with respect to the vertical direction regarding the wafer so as to blow air from the peripheral portion toward the central portion with respect to the central line in the vertical direction of the wafer, as droplets on a surface of the wafer can be dried while being collected to the center with respect to the central line in the vertical direction of the wafer, it is possible to increase weight of the droplets, thereby facilitating downward movement and drop of the droplets from the wafer, and it is possible to suppress movement of the droplets toward the peripheral portion with respect to the central line in the vertical direction of the wafer, thereby preventing the droplets from adhering to an end face of the wafer, so that it is possible to reduce an undried portion.

At this time, in the first air supply tube and the second air supply tube, central portions thereof are preferably higher than end portions thereof.

According to such a configuration of the first air supply tube and the second air supply tube, the droplets on the surface of the wafer can be more surely dried while being collected to the center with respect to the central line in the vertical direction of the wafer.

At this time, the air supply unit can be fixed, and the wafer holding unit can move the wafer in the vertical direction.

According to the above-described configuration, as it is not necessary to move the air supply unit, it is possible to make the drying apparatus simpler structure.

At this time, the wafer holding unit can fix the wafer, and the air supply unit can move in the vertical direction.

According to the above-described configuration, as it is not necessary to move the wafer, it is possible to surely prevent the wafer from dropping from the wafer holding unit during drying.

At this time, the wafer can be a semiconductor wafer.

The semiconductor wafer can be preferably dried as the wafer.

The present invention also provides a method for drying a wafer using the above-described wafer drying apparatus, the method for drying a wafer including drying both surfaces of a wafer at the same time by blowing air to the wafer from the plurality of first air outlets and the plurality of second air outlets while moving the wafer relatively upward with respect to the air supply unit and dropping droplets adhering to the surface of the wafer while collecting the droplets to the central portion with respect to the central line in the vertical direction of the wafer.

By using such a method for drying a wafer, it is possible to increase weight of the droplets, thereby facilitating downward movement and drop from the wafer, and it is possible to reduce movement of the droplets toward the peripheral portion with respect to the central line in the vertical direction of the wafer, thereby preventing the droplets from adhering to an end face of the wafer, so that it is possible to reduce an undried portion of the wafer.

As described above, according to the present invention, as droplets on a surface of a wafer can be dried while being collected to the center with respect to a central line in a vertical direction of the wafer, it is possible to increase weight of the droplets, thereby facilitating downward movement and drop from the wafer, and it is possible to reduce movement of the droplets toward the peripheral portion with respect to the central line in the vertical direction of the wafer, thereby preventing the droplets from adhering to an end face of the wafer, so that it is possible to reduce an undried portion of the wafer.

DETAILED DESCRIPTION OF THE PREFERRED EMBODIMENTS

While the present invention will be described below in details using an example of embodiments with reference to the drawings, the present invention is not limited to this.

Figure 5:
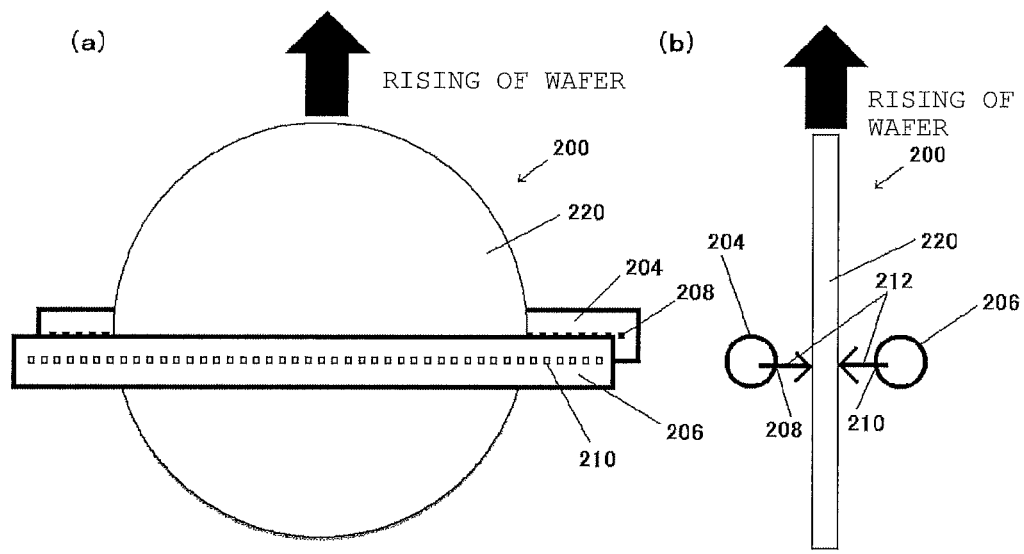
FIG. 5 is a diagram illustrating a conventional wafer drying apparatus.
Figure 6:
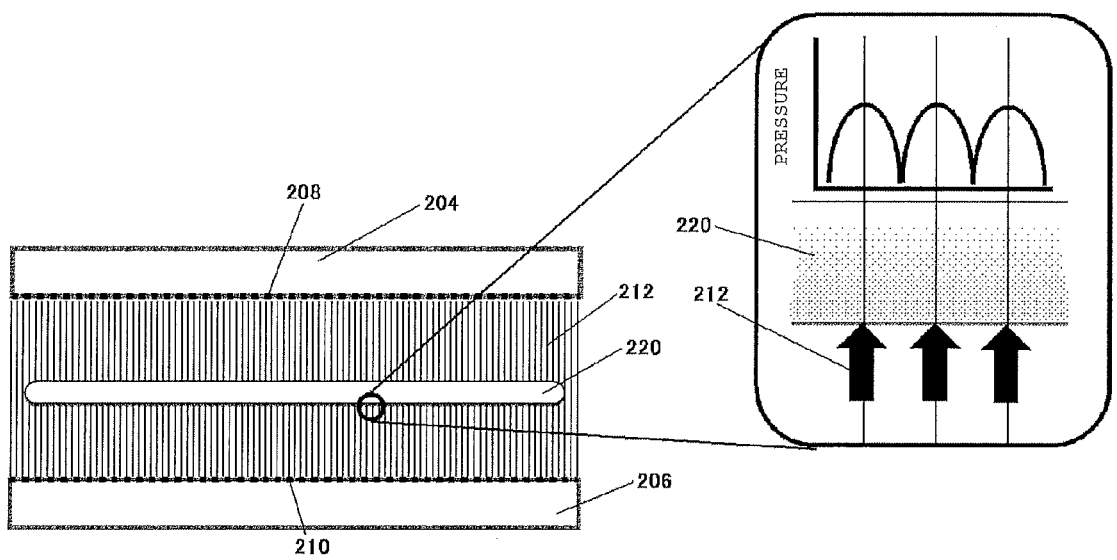
FIG. 6 is a diagram for explaining problems of the conventional wafer drying apparatus.
Figure 7:
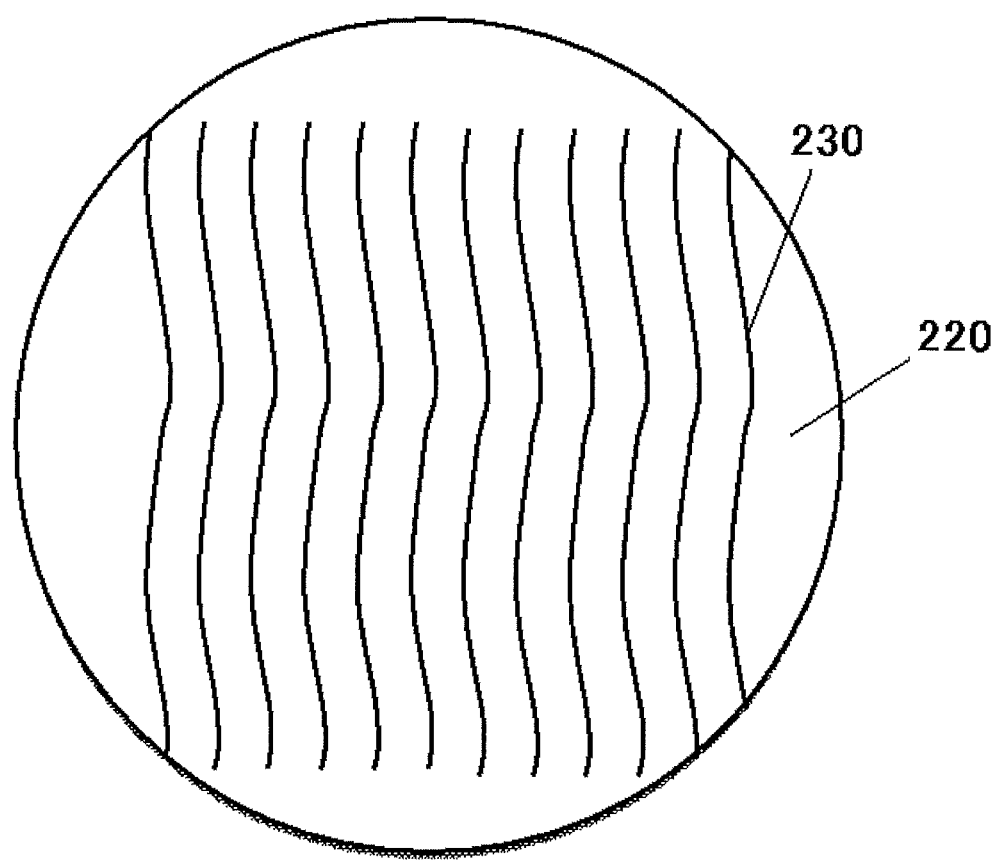
FIG. 7 is another diagram for explaining problems of the conventional wafer drying apparatus.
Figure 8:
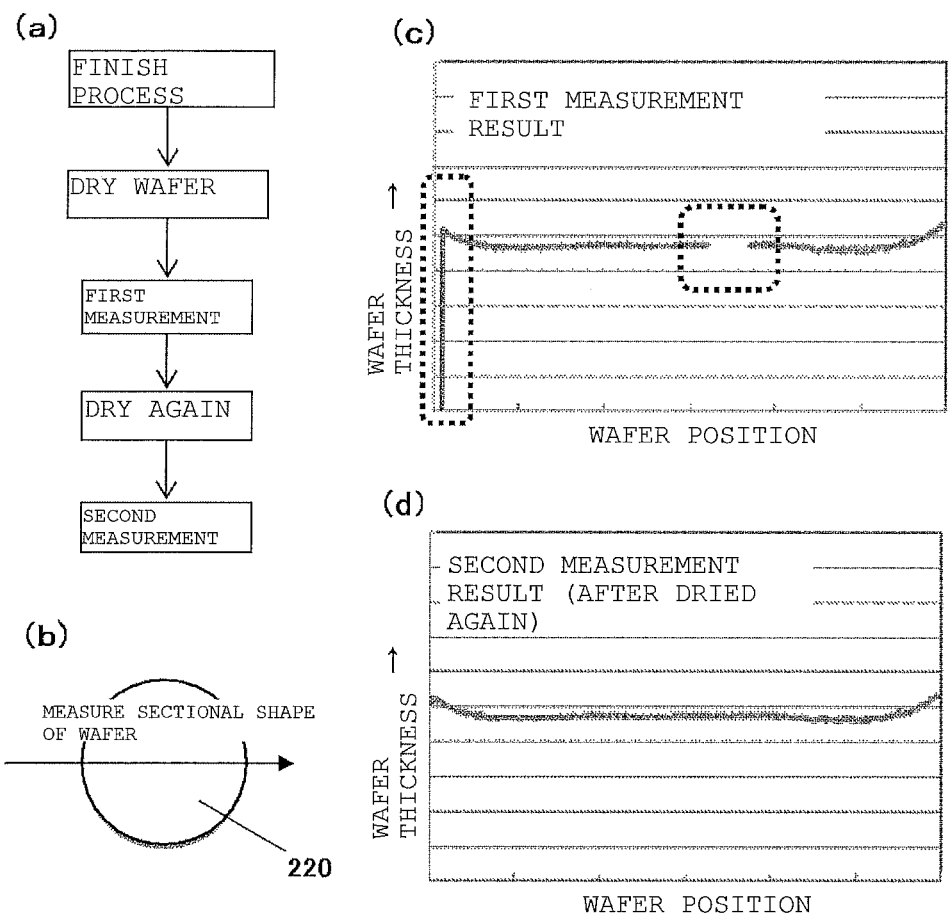
FIG. 8 is a diagram for explaining problems caused by an undried portion.
Figure 9:
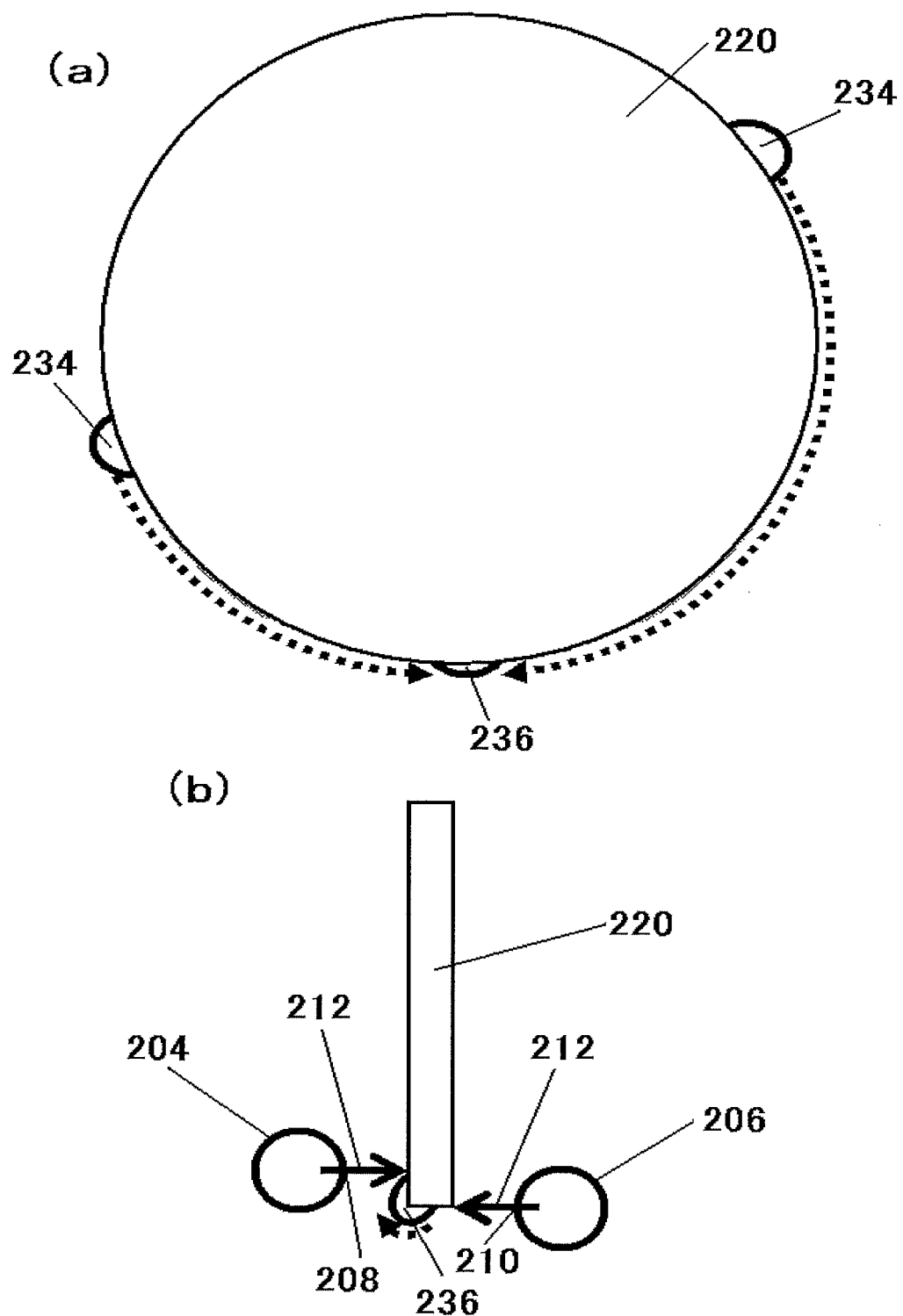
FIG. 9 is a diagram for explaining other problems of the conventional wafer drying apparatus.

As mentioned above, in a drying apparatus 200 in FIG. 5, there is a problem that an undried portion occurs and that occurrence of an undried portion degrades reliability of a measurement result of measurement performed in an intermediate examination (for example, measurement using an optical wafer cross-sectional shape measurement apparatus) as illustrated in FIG. 8.

Therefore, the present inventors have intensively studied a wafer drying apparatus having a simple structure, which can reduce an undried portion without reducing productivity.

As a result, the present inventors found that by providing a plurality of first air outlets separated from each other at predetermined intervals and a plurality of second air outlets separated from each other at predetermined intervals to form an angle with respect to a vertical direction regarding a wafer so as to blow air from a peripheral portion to a central portion with respect to a central line in a vertical direction of the wafer, as droplets on a surface of the wafer can be dried while being collected to the center with respect to the central line in the vertical direction of the wafer, it is possible to increase weight of droplets, thereby facilitating downward movement and drop from the wafer, and it is possible to reduce movement of the droplets toward the peripheral portion with respect to the central line in the vertical direction of the wafer, thereby preventing the droplets from adhering to an end face of the wafer, and, thus, achieved the present invention.

The wafer drying apparatus according to the present invention will be described below with reference to FIG. 1 to FIG. 4.

FIG. 1(a) is a diagram of a wafer drying apparatus 100 according to the present invention viewed from a top, FIG. 1(b) is a diagram of the wafer drying apparatus 100 according to the present invention viewed from a side, and FIG. 1(c) is a diagram of the drying apparatus 100 viewed from the side when the drying apparatus 100 in FIG. 1(b) is rotated by 90 degree in a horizontal direction.

The wafer drying apparatus 100 of the present invention has an air supply unit 102 and a wafer holding unit (wafer hand) 114 configured to hold a wafer 120. The air supply unit 102 has a first air supply tube 104 and a second air supply tube 106, and the first air supply tube 104 is connected to the second air supply tube 106 by a connecting unit 116. The air supply unit 102 has an air supply port 122 from which air 112 is supplied, a first air supply port 124 is provided at the first air supply tube 104, and a second air supply port 126 is provided at the second air supply tube 106.

The first air supply tube 104 is provided at a first front-surface side of the wafer 120, and the second air supply tube 106 is provided at a second front-surface side of the wafer 120. A plurality of first air outlets 108 separated from each other at predetermined intervals are provided at the wafer 120 side of the first air supply tube 104, and a plurality of second air outlets 110 separated from each other at predetermined intervals are provided at the wafer 120 side of the second air supply tube 106.

The wafer drying apparatus 100 is configured so that the wafer 120 moves relatively with respect to the air supply unit 102.

It is possible to adopt a configuration where the air supply unit 102 is fixed and the wafer holding unit 114 moves the wafer 120 in a vertical direction, or it is also possible to adopt a configuration where the wafer holding unit 114 fixes the wafer 120 and the air supply unit 102 moves in the vertical direction.

The first air outlet 108 is provided to form an angle f with respect to the vertical direction regarding the wafer 120 so as to blow air from a peripheral portion toward a central portion with respect to a central line in the vertical direction of the wafer 120 as illustrated in an enlarged view of the vicinity of the outlet in FIG. 1(a).

Figure 2:
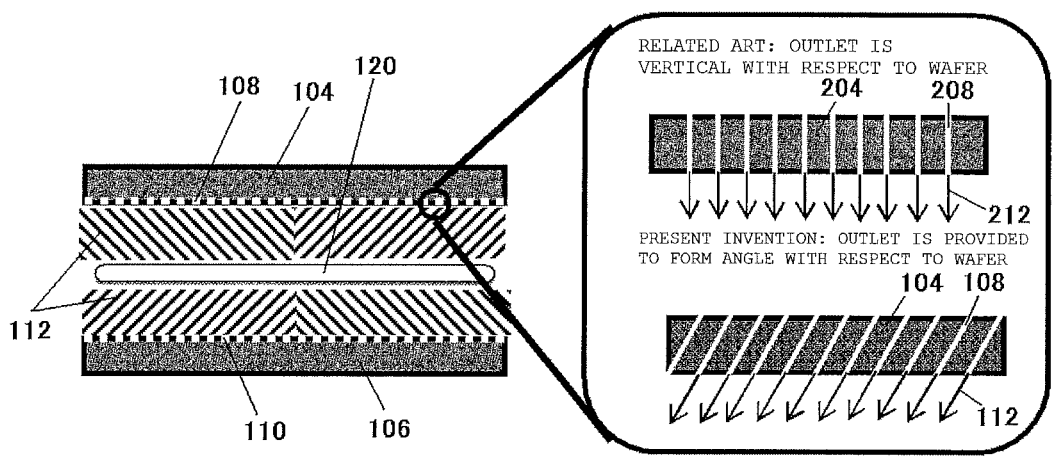
FIG. 2 is a conceptual diagram of a way of collecting droplets to a central portion with respect to a central line in a vertical direction of a wafer.

With reference to FIG. 2, in more detail, the first air outlet 108 at the connecting unit 116 side is configured to form an angle in a direction opposite to the first air outlet 108 at the air supply port 122 side so as to blow air from the peripheral portion to the central portion with respect to the central line in the vertical direction of the wafer 120.

The second air outlet 110 also has the same configuration as that of the first air outlet 108.

According to such a configuration, it is possible to collect droplets to the central portion with respect to the central line in the vertical direction of the wafer 120.

Figure 4:
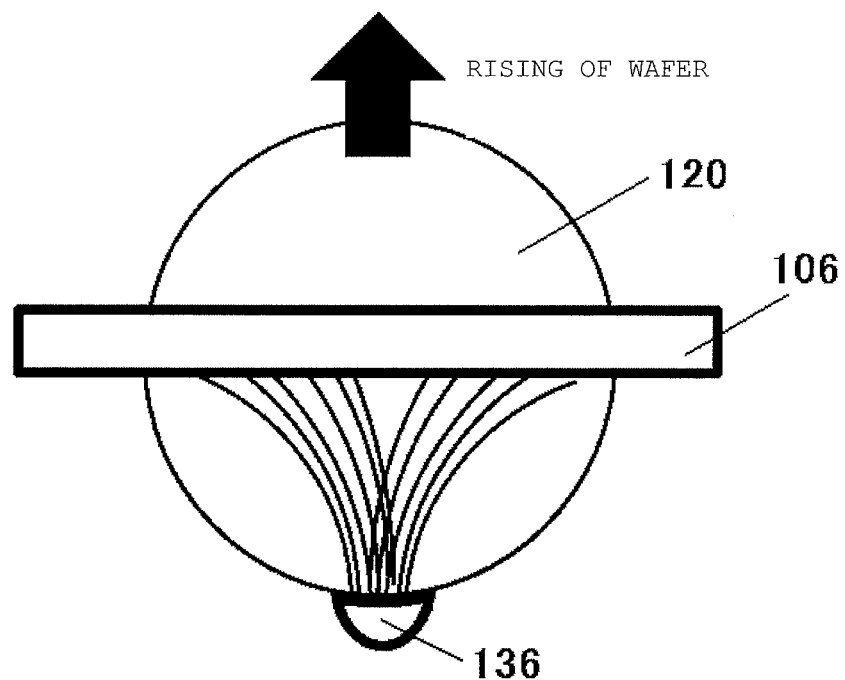
FIG. 4 is a conceptual diagram of means for solving problems of the wafer drying apparatus which is provided in the present invention.

As illustrated in FIG. 4, if the droplets are dried while being collected to the central portion with respect to the central line in the vertical direction of the wafer 120, weight of the droplets 136 collected at a lowermost point increases, which makes the droplets likely to drop, so that it is possible to reduce an undried portion. Further, by collecting droplets to the central portion with respect to the central line in the vertical direction of the wafer 120, it is possible to suppress adhering of droplets to the end portion of the wafer and prevent small droplets from moving to the lowermost point while running down the periphery of the wafer, so that it is possible to reduce an undried portion.

Further, as illustrated in FIGS. 1(b) and 1(c), in the first air supply tube 104 and the second air supply tube 106, the central portions thereof are preferably higher than the end portions thereof (while the first air supply tube 104 is not illustrated in the drawings, the first air supply tube 104 has the same configuration as that of the second air supply tube 106).

Figure 3:
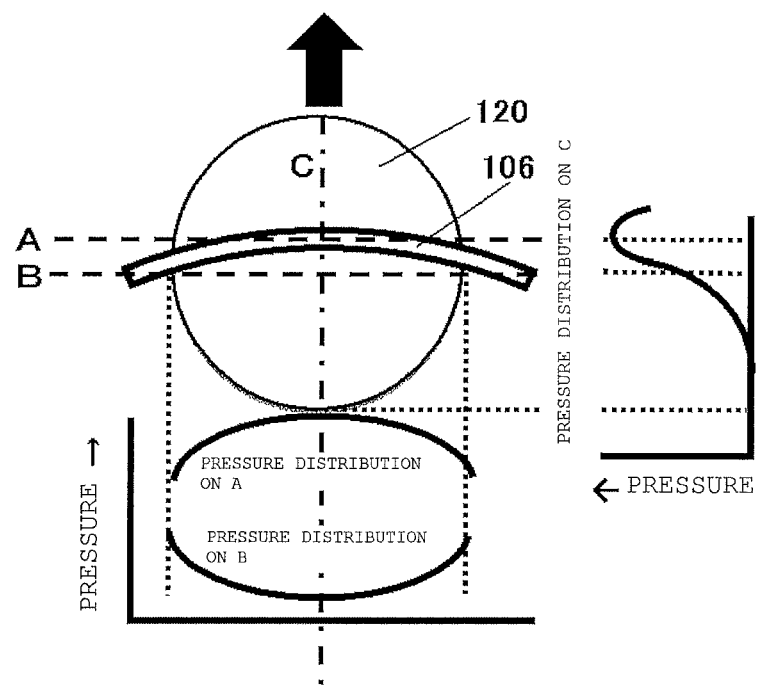
FIG. 3 is a conceptual diagram in the case where a central portion of an air supply tube is higher than an end portion.

More detailed explanation will be provided with reference to FIG. 3 which is a side view of the wafer drying apparatus 100. By bending the first air supply tube 104 and the second air supply tube 106 so that a portion corresponding to the central portion with respect to the central line (line C) in the vertical direction of the wafer 120 becomes higher, it is possible to provide the following effects.

On line A, first, air is blown to the central portion with respect to the central line in the vertical direction of the wafer. Here, droplets to which air is blown mainly drop downward by its gravity and a blowing pressure difference. Even if the droplets try to move to the side, the droplets cannot move by being inhibited by the air blown from the bent supply tube.

On line B at which upward movement of the wafer proceeds, as the air outlets have already passed at the central portion with respect to the central line in the vertical direction of the wafer 120, an air blowing pressure decreases. On the other hand, at the wafer peripheral portion, as the air outlets are just passing, the air blowing pressure increases. Due to this pressure difference, the droplets on the surface of the wafer 120 are collected from the peripheral portion to the central portion with respect to the central line in the vertical direction of the wafer. When the droplets are further collected, the gravity thereof increases.

Finally, increased weight of the droplets collected at a lowermost end of the central portion with respect to the central line in the vertical direction of the wafer 120 exceeds surface tension, which makes the droplets likely to naturally drop, and the droplets further drop by the blown air.

As explained above, as in the first air supply tube 104 and the second air supply tube 106, the central portions thereof are higher than the end portions thereof, it is possible to more surely dry the droplets on the surface of the wafer while collecting the droplets to the center with respect to the central line in the vertical direction of the wafer.

Further, as illustrated in FIG. 1(c), as the first air outlet 108 and the second air outlet 110 can be formed to face downward in the vertical direction to facilitate downward movement of the droplets.

Still further, by making an interval g between the two air supply tubes narrower at the central portion than at the end portion, it is possible to facilitate drying of the droplets finally left at the lowermost point of the wafer.

Figure 1:
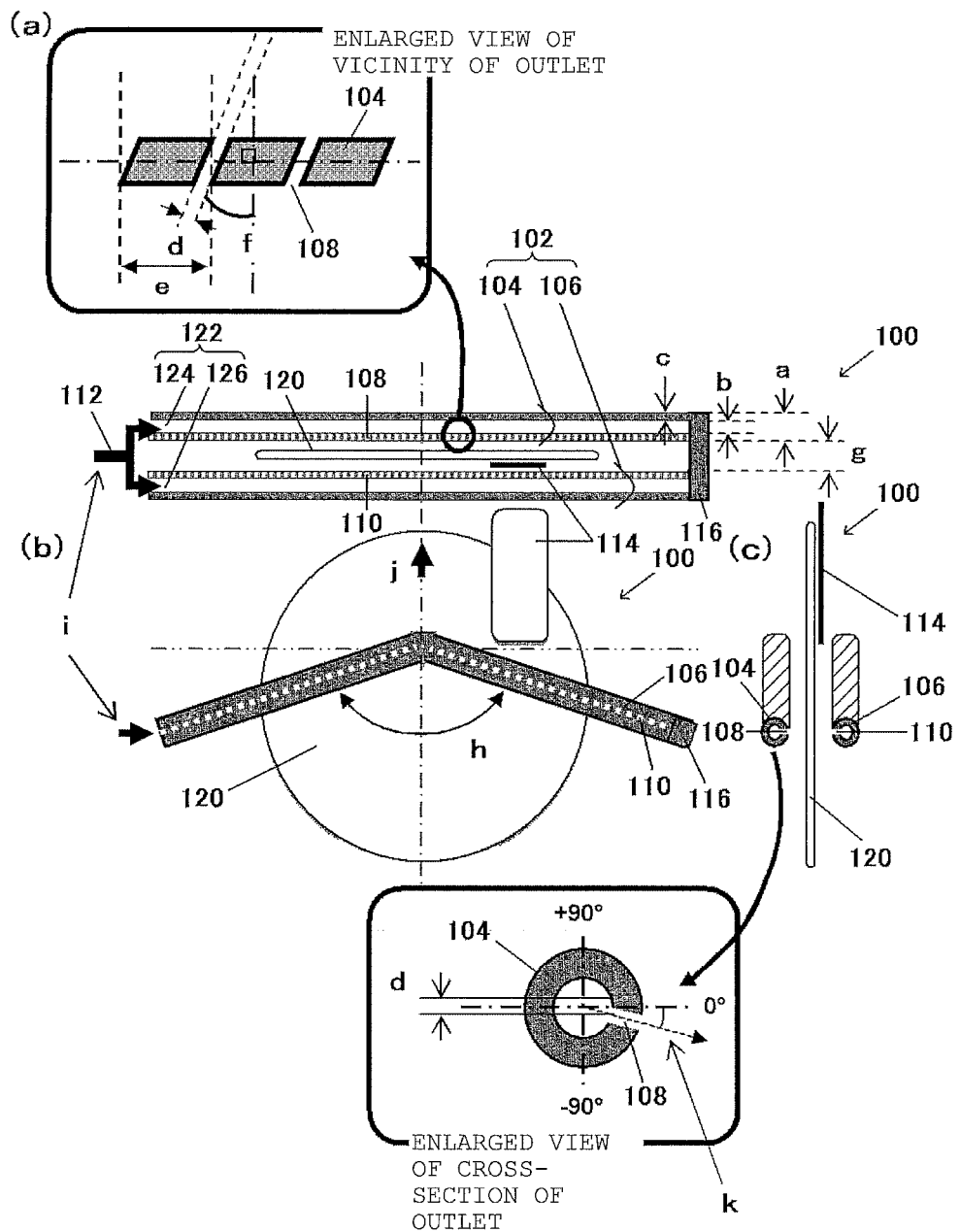
FIG. 1 is a diagram illustrating a wafer drying apparatus of the present invention.

It should be noted that while FIG. 1 illustrates a vacuum sucking type wafer hand as an example of the wafer holding unit 114, the wafer holding unit 114 may be an edge grip type wafer hand.

Further, while FIG. 1 illustrates the first air supply tube 104 and the second air supply tube 106 in which the central portions are high, the first air supply tube 104 and the second air supply tube 106 do not have to be bent if the first air outlet 108 and the second air outlet 110 are provided to form an angle with respect to the wafer as illustrated in FIG. 2.

Further, in FIG. 1, an outlet diameter d can be set within a range between 0.3 mm and 2 mm, an outlet interval e can be set 10 mm or less, an outlet angle (horizontal direction) f can be set within a range between 1 degree and 15 degree, a bending angle h of the air supply tube can be set within a range between 170 degree and 90 degree, and an outlet angle (vertical direction) k can be set within a range between −1 degree and −15 degree.

The method for drying a wafer of the present invention will be explained next.

The both surfaces of the wafer 120 are dried at the same time using the wafer drying apparatus 100 in FIG. 1 explained above by blowing air from a plurality of air outlets 108 provided at the first air supply tube 104 and a plurality of air outlets 110 provided at the second air supply tube 106 while moving the wafer 120 upward relatively with respect to the air supply unit 102, so as to drop droplets adhering to a surface of the wafer 120 while collecting the droplets to a central portion with respect to a central line in a vertical direction of the wafer.

By using such a method for drying a wafer, it is possible to increase weight of the droplets, thereby facilitating downward movement and drop from the wafer, and it is possible to reduce movement of the droplets to the peripheral portion with respect to the central line in the vertical direction of the wafer, thereby preventing the droplets from adhering to an end face of the wafer, so that it is possible to reduce an undried portion.

EXAMPLES

While the present invention will be described more specifically below using an example and a comparison example, the present invention is not limited to this.

Example

Both surfaces of a silicon wafer having a diameter of 300 mm were dried using the wafer drying apparatus 100 illustrated in FIG. 1 using the method for drying wafer described above. It should be noted that the silicon wafer is subjected to double-side polishing and is covered with a slurry including a polymer wetting agent.

Further, details of the wafer drying apparatus 100 being used will be described below.

Outer diameter a of air supply tube: 13 mm in diameter
Inner diameter b of air supply tube: 9 mm in diameter
Thickness c of air supply tube: 2 mm
Outlet diameter d: 1 mm in diameter
Outlet interval e: 5 mm
Outlet angle (horizontal direction) f: 15 degree
Interval g between air supply tubes: 15 mm at the central portion, 17 mm at the end portion
Bending angle h of the air supply tube: 165 degree
Air supply pressure: 0.5 MPa
Wafer moving velocity j: 25 mm/sec
Outlet angle (vertical direction) k: −5 degree Comparison Example Both surfaces of a silicon wafer which is the same as the example were dried using the wafer drying apparatus which is the same as the example except the following points. However, in the comparison example, the air supply tube was not bent (that is, the bending angle h of the air supply tube: 180 degree), the outlet angle (horizontal direction) f was set at 0 degree, the outlet angle (vertical direction) k was set at 0 degree, the outlets interval e was set at 10 mm, and the air supply tubes were disposed in parallel at intervals g which was set at 17 mm.

Wafer cross-sectional shapes of the silicon wafer after the both surfaces were dried in the example and the silicon wafer after the both surfaces were dried in the comparison example, were measured using an optical thickness measurement apparatus.

As a result, while 5% of measurement abnormity due to an undried portion as illustrated in FIG. 8(c) occurred in the silicon wafer after the both surfaces were dried in the comparison example, the above measurement abnormality could be reduced to 0.5% in the silicon wafer after the both surfaces were dried in the example.

It should be noted that the present invention is not limited to the above-described embodiment. The above-described embodiment is provided for the purpose of examples, and any modification which has substantially the same configuration as that of a technical idea described in the claims of the present invention and which provides the same operational effects can be incorporated into the technical scope of the present invention.

The invention claimed is:

1. A wafer drying apparatus for drying both front surfaces of a wafer at the same time, the wafer drying apparatus comprising:
    an air supply unit having a first air supply tube provided at a first front-surface side of the wafer and a second air supply tube provided at a second front-surface side of the wafer; and
    a wafer holding unit configured to vertically hold the wafer,
    wherein the wafer is configured to relatively move with respect to the air supply unit,
    a plurality of first air outlets separated from each other at predetermined intervals are provided at the wafer side of the first air supply tube,
    a plurality of second air outlets separated from each other at predetermined intervals are provided at the wafer side of the second air supply tube,
    the plurality of first air outlets and the plurality of second air outlets are respectively provided to form an angle with respect to a vertical direction regarding the wafer so as to blow air from a peripheral portion to a central portion with respect to a central line in the vertical direction of the wafer,
    in the first air supply tube and the second air supply tube, central portions thereof are higher than end portions thereof, and
    the air supply unit is fixed, and the wafer holding unit moves the wafer in a vertical direction.

2. The wafer drying apparatus according to claim 1, wherein the wafer holding unit fixes the wafer, and the air supply unit moves in a vertical direction.

3. The wafer drying apparatus according to claim 1, wherein the wafer is a semiconductor wafer.

4. The wafer drying apparatus according to claim 2, wherein the wafer is a semiconductor wafer.

5. A method for drying a wafer using the wafer drying apparatus according to claim 1, the method for drying a wafer comprising:
    drying both front surfaces of the wafer at the same time by blowing air to the wafer from the plurality of first air outlets and the plurality of second air outlets while moving the wafer relatively upward with respect to the air supply unit, so as to drop droplets adhering to a surface of the wafer while collecting the droplets to a central portion with respect to the central line in the vertical direction of the wafer.

6. A method for drying a wafer using the wafer drying apparatus according to claim 2, the method for drying a wafer comprising:
    drying both front surfaces of the wafer at the same time by blowing air to the wafer from the plurality of first air outlets and the plurality of second air outlets while moving the wafer relatively upward with respect to the air supply unit, so as to drop droplets adhering to a surface of the wafer while collecting the droplets to a central portion with respect to the central line in the vertical direction of the wafer.

7. A method for drying a wafer using the wafer drying apparatus according to claim 3, the method for drying a wafer comprising:
    drying both front surfaces of the wafer at the same time by blowing air to the wafer from the plurality of first air outlets and the plurality of second air outlets while moving the wafer relatively upward with respect to the air supply unit, so as to drop droplets adhering to a surface of the wafer while collecting the droplets to a central portion with respect to the central line in the vertical direction of the wafer.

* * * * *